United States Patent
Ebihara

(10) Patent No.: US 7,855,433 B2
(45) Date of Patent: Dec. 21, 2010

(54) SEMICONDUCTOR DEVICE

(75) Inventor: Mika Ebihara, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 12/229,819

(22) Filed: Aug. 27, 2008

(65) Prior Publication Data

US 2009/0057830 A1 Mar. 5, 2009

(30) Foreign Application Priority Data

Aug. 28, 2007 (JP) .............................. 2007-220965

(51) Int. Cl.
*H01L 29/00* (2006.01)
(52) U.S. Cl. ...................... 257/536; 438/382
(58) Field of Classification Search ............... 438/382; 257/536
See application file for complete search history.

(56) References Cited

U.S. PATENT DOCUMENTS 5,661,046 A * 8/1997 Ilderem et al. .............. 438/202
6,013,940 A   1/2000 Harada et al. .............. 257/538
2001/0022385 A1 * 9/2001 Sakakibara et al. ......... 257/536

OTHER PUBLICATIONS

Patent Abstracts of Japan, publication No. 06-140573, publication date May 20, 1994.
Patent Abstract of Japan, publication No. 09-051072, publication date Feb. 18, 1997.
Patent Abstracts of Japan, publication No. 2003-324196, publication date Nov. 14, 2003.

* cited by examiner

*Primary Examiner*—Bradley K Smith
(74) *Attorney, Agent, or Firm*—Adams & Wilks

(57) ABSTRACT

A semiconductor device has a semiconductor substrate having a first conductivity type and a resistor having a substantially U-shaped contour and being formed from an epitaxial layer disposed on the semiconductor substrate and having a second conductivity type different from the first conductivity type. A first trench is formed around an exterior of the resistor to a depth sufficient enough to reach the semiconductor substrate. A second trench is formed in an interior of the resistor to provide the resistor with the U-shaped contour. First and second insulating films are disposed in the first and second trenches, respectively. A heavily-doped region of the second conductivity type having an impurity concentration sufficient to obtain a contact with a metal wire is arranged at both ends of the resistor.

18 Claims, 2 Drawing Sheets

SEMICONDUCTOR DEVICE

BACKGROUND OF THE INVENTION

1. Field of the Invention

The present invention relates to a semiconductor device, and more particularly, to a resistor with which high integration of the semiconductor device can be obtained and a method of manufacturing the same.

2. Description of the Related Art

In recent years, along with the progress in miniaturization and integration of a semiconductor device, various attempts have been made to form a number of semiconductor elements in a small area of a semiconductor chip. As the semiconductor device formed with those semiconductor elements, there is a semiconductor device provided with a ladder circuit which divides a voltage.

In the miniaturization and integration of the semiconductor device, it is extremely important to form the ladder circuit in a small area.

Conventionally, in order to miniaturize the ladder circuit, an insulating film is formed on a first resistor formed on a field region, a second resistor is formed on the insulating film to make the resistors into a two layer structure, and thus miniaturization and integration of the ladder circuit are attained. In a semiconductor device including such a ladder circuit, as shown in FIG. 2, in a field region of a semiconductor substrate 75, a first layer resistor 77 and a second layer resistor 66 are formed into a two layer structure via an interlayer insulating film 78 in a thickness direction of the semiconductor substrate 75 (for example, see JP 09-51072 A, JP 06-140573 A, and JP 2003-314296 A).

However, in the case of adopting the resistors having the two layer structure, there arise problems in that the manufacturing steps are complicated and the manufacturing cost increases, and also in that it is difficult to obtain specific accuracy equal to or more than specific accuracy of the ladder circuit formed of the resistors which are formed above the conventional field region. Conventionally, the resistors are formed only on the field region to be two-dimensionally arranged. Accordingly, when the resistors are formed in the semiconductor device, an area obtained by adding an area where the semiconductor element is formed and an area where the resistors are formed is necessary on the semiconductor substrate. Therefore, if the resistors can be three-dimensionally arranged, an area of the entire semiconductor device can be reduced, which leads to further progress in miniaturization and integration of the semiconductor chip.

Thus, a first object of the present invention is to provide a semiconductor device in which a breeder resistance circuit can be miniaturized and integrated. In addition, a second object of the present invention is to provide a method of manufacturing the semiconductor device which can be miniaturized and integrated.

SUMMARY OF THE INVENTION

In order to achieve the aforementioned objects, the present invention employs the following means.

(1) A semiconductor device according to the present invention includes: a first conductivity type semiconductor substrate; two types of trenches having different depths, the two types of trenches being arranged so that a second conductivity type epitaxial layer which is formed on the first conductivity type semiconductor substrate and has a conductivity type opposite to a conductivity type of the first conductivity type semiconductor substrate serves as a resistor having a substantially three-dimensional U-shaped contour; an insulating film for electrically insulating a plurality of the resistors formed by the two types of trenches from each other; and a second conductivity type heavily-doped region in which a concentration of an impurity is increased to obtain contact with a metal wire arranged at both ends of the resistors.

(2) A method of manufacturing a semiconductor device according to the present invention includes: forming, on a first conductivity type semiconductor substrate, a second conductivity type epitaxial layer having a conductivity type opposite to a conductivity type of the first conductivity type semiconductor substrate; providing two types of trenches having different depths in a portion other than a portion serving as a resistor of the second conductivity type epitaxial layer; arranging an insulating film for electrically insulating a plurality of the resistors formed by the two types of trenches from each other; and forming a second conductivity type heavily-doped region in which a concentration of an impurity is increased so that sufficient contact can be obtained with the second conductivity type epitaxial layer in the portion serving as the resistor and a metal wire.

According to the present invention, the resistor forming the breeder resistance circuit or the like can be three-dimensionally arranged. This leads to effects that the semiconductor device can be integrated, and that the breeder resistance circuit can be formed in an area smaller than an occupying area thereof in a conventional method.

In a voltage detector or a voltage regulator according to the present invention, because voltage can be divided with high accuracy in an area smaller than a conventional chip area, a production yield as an integrated circuit (IC) is improved, which makes it possible to manufacture an inexpensive product more accurately. Further, in order to suppress current consumption of the IC, a resistance value of the entire breeder resistance circuit is set to a high level, which is equal to or more than the order of megohms in many cases. In this case, resistors having an extremely slender shape are combined for keeping a certain degree of accuracy, and thus a large area is required. Therefore, it is not uncommon that more than half of the entire area of the IC chip is taken up by the breeder resistance circuit in the voltage detector. The breeder resistance circuit according to the present invention can have a three-dimensional arrangement, with the result that a certain degree of accuracy can be obtained in a small area. Accordingly, an occupying area of the breeder resistance circuit can be reduced, which greatly contributes to reducing an area of the entire IC chip.

Employment of the method of manufacturing a semiconductor device according to the present invention leads to an effect that the semiconductor device described above can be formed without involving a special manufacturing step or significantly increasing manufacturing steps.

DETAILED DESCRIPTION OF THE PREFERRED EMBODIMENT

Hereinafter, a preferred embodiment of the present invention is described with reference to the drawings.

Figure 1A:
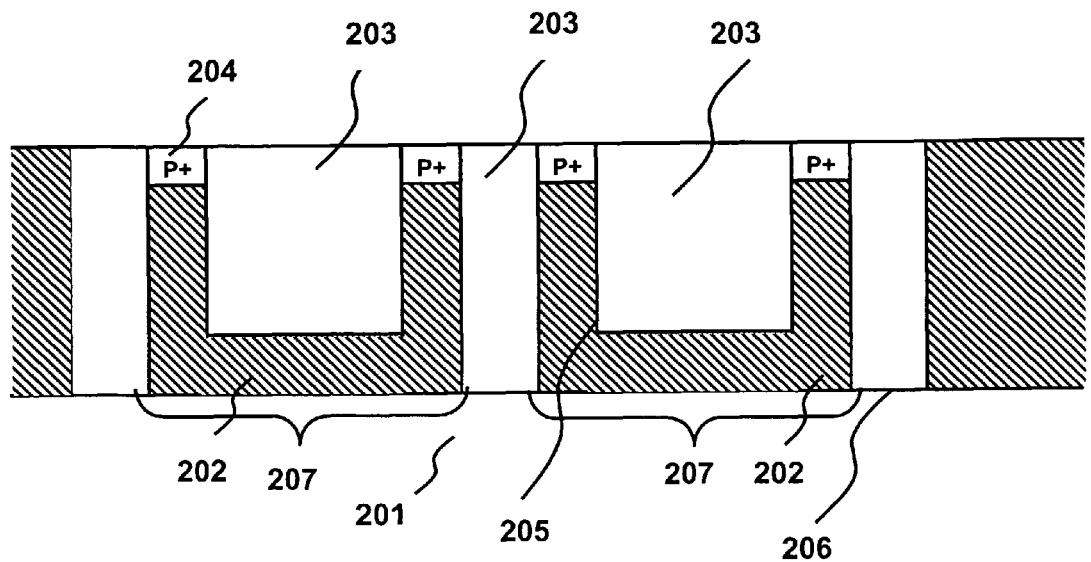
FIGS. 1A and 1B are schematic sectional views showing a trench-shaped resistor of a semiconductor device according to a first embodiment of the present invention.
Figure 1B:
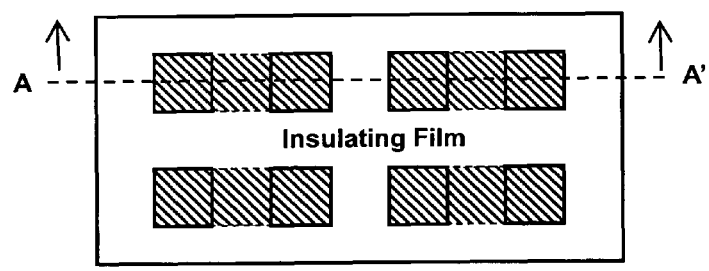
Figure 2:
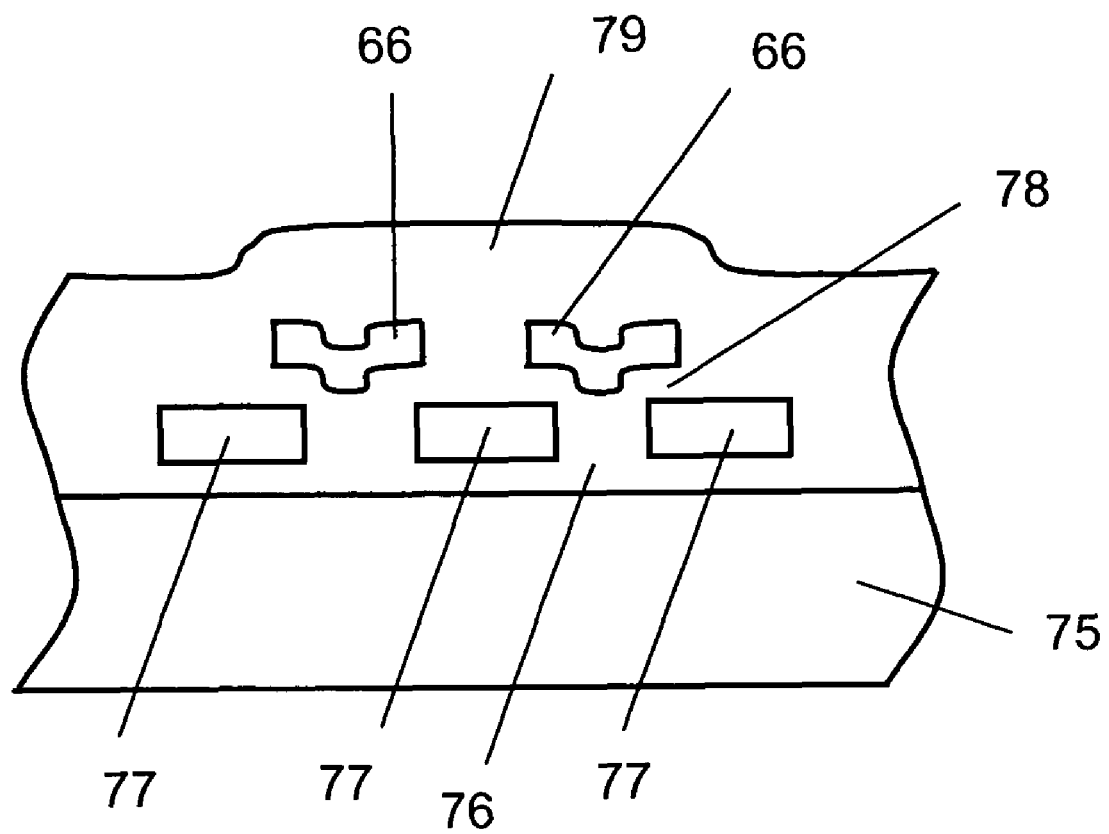
FIG. 2 is a sectional view of a portion in which a resistor is formed into two layers in a conventional field region.

FIGS. 1A and 1B are schematic sectional views showing a resistor of a semiconductor device according to a first embodiment of the present invention.

FIG. 1B is a view showing the semiconductor device of FIG. 1A, which is viewed from above. FIG. 1A is a sectional view of FIG. 1B, which is taken along a line A-A' of FIG. 1B.

A p-type epitaxial layer 202 is formed on an n-type silicon semiconductor substrate 201, and two types of trenches 205 and 206 having different depths are formed in portions of the p-type epitaxial layer 202 other than portions serving as a resistor. The depth of the trench 205 is less than a full depth of the p-type epitaxial layer 202, and there remains the p-type epitaxial layer 202 on a bottom of the trench 205. The depth of the trench 206 is deeper than the depth of the trench 205, and the trench 206 reaches the n-type silicon semiconductor substrate 201 located under the p-type epitaxial layer 202 and divides the p-type epitaxial layers 202 adjacent to each other. Further, the trenches 205 and 206 are filled with an insulating film 203 for electrically insulating resistors, and an epitaxial layer 207 which becomes a resistor is provided with p-type heavily-doped regions 204 whose impurity concentration is increased so as to have sufficient contact with an aluminum wire. The p-type epitaxial layer 202 which becomes a resistor has a three-dimensional U-shape that includes a base portion and a pair of leg portions extending from the base portion to define an internal cavity. Note that the n-type silicon semiconductor substrate does not always need to be used, and an n-type epitaxial layer may be formed using a p-type silicon semiconductor substrate to form the resistor. The p-type heavily-doped region 204 is formed of $BF_2$, and an impurity concentration during the formation is $1E15$ atm/cm$^3$.

Note that $BF_2$ does not always need to be used, and B may be used. The impurity concentration during the formation does not always need to be $1E15$ atm/cm$^3$, and if equal to or more than $1E15$ atm/cm$^3$, sufficient contact can be obtained.

The trench includes the first trench 205 and the second trench 206. The second trench 206 is formed to electrically insulate the adjacent resistors from each other, while the first trench 205 is formed to three-dimensionally arrange the resistor. Depending on the depth of the first trench 205, a thickness and a length of the resistor can be varied with ease, whereby the resistor can be easily set to have an appropriate resistance value.

When the p-type epitaxial layer 202 has a thickness ranging from 0.1 µm to 10 µm, and more preferably from 0.5 µm to 5.0 µm, the resistor with high specific accuracy can be formed, and thus the aforementioned first object can be achieved.

If the thickness of the p-type epitaxial layer 202 is thin, the resistor with a large resistance value cannot be formed in a small area, and thus the thickness of the epitaxial layer may be equal to or more than 0.1 µm, and preferably equal to or more than 0.5 µm. Meanwhile, when the thickness thereof is large, processing accuracy of the trench decreases, and the stable resistance value cannot be obtained. In particular, sufficient characteristics cannot be obtained in a circuit such as a breeder resistance circuit, in which high specific accuracy is required, and thus the thickness of the epitaxial layer 202 may be equal to or less than 10 µm, and preferably equal to or less than 5.0 µm.

Further, a specific resistance of the p-type epitaxial layer 202 is set to 0.01 to 150 Ωcm, and preferably 1 to 50 Ωcm. The first object is attained with the configuration described above.

If the specific resistance of the epitaxial layer is extremely small, the resistor with a large resistance value cannot be formed in a small area, and thus the specific resistance thereof may be set to equal to or more than 0.01 Ωcm, and preferably equal to or more than 1 Ωcm. Meanwhile, extremely large specific resistance causes large variations in the resistance value, whereby a stable resistance value cannot be obtained. In particular, the sufficient characteristics cannot be obtained in the circuit such as the breeder resistance circuit, in which high specific accuracy is required, and hence the specific resistance of the epitaxial layer may be set to equal to or less than 150 Ωcm, and more preferably equal to or less than 50 Ωcm.

What is claimed is:

1. A semiconductor device, comprising:
a semiconductor substrate having a first conductivity type;
a resistor having a substantially U-shaped contour and being formed from an epitaxial layer disposed on the semiconductor substrate, the epitaxial layer having a second conductivity type different from the first conductivity type;
a first trench formed around an exterior of the resistor and having a depth sufficient enough to reach the semiconductor substrate;
a second trench formed in an interior of the resistor to provide the resistor with the U-shaped contour;
a first insulating film disposed in the first trench;
a second insulating film disposed in the second trench; and
a heavily-doped region of the second conductivity type having an impurity concentration sufficient to obtain a contact with a metal wire arranged at both ends of the resistor.

2. A semiconductor device according to claim 1; wherein the epitaxial layer has a thickness in the range of from 0.1 µm to 10 µm.

3. A semiconductor device according to claim 2; wherein the epitaxial layer has a specific resistance in the range of from 0.01 Ωcm to 150 Ωcm.

4. A semiconductor device according to claim 1; wherein the heavily-doped region is formed of $BF_2$.

5. A semiconductor device according to claim 1; wherein the heavily-doped region is formed of B.

6. A semiconductor device according to claim 1; wherein the impurity concentration of the heavily-doped region is equal to or more than $1E15$ atm/cm$^3$.

7. A semiconductor device according to claim 6; wherein the heavily-doped region is formed of B.

8. A semiconductor device according to claim 1; wherein the heavily-doped region is formed of $BF_2$; and wherein the impurity concentration of the heavily-doped region is equal to $1E15$ atm/cm$^3$.

9. A semiconductor device according to claim 1; wherein the epitaxial layer has a specific resistance in the range of from 1 Ωcm to 50 Ωcm.

10. A semiconductor device according to claim 1; wherein the epitaxial layer has a thickness in the range of from 0.5 µm to 5 µm.

11. A semiconductor device, comprising:
a semiconductor substrate having a first conductivity type;
a substantially three-dimensional, U-shaped resistor having a base portion and a pair of leg portions forming an internal cavity;
a first insulating film disposed in the internal cavity of the resistor;
a second insulating film disposed on an outer surface of each of the leg portions of the resistor;
a pair of heavily-doped regions of the second conductivity type arranged on the respective leg portions of the resistor;

a first trench formed around the outer surfaces of the leg portions of the resistor and containing the second insulating film; and a second trench formed in the cavity of the resistor and containing the first insulating film.

12. A semiconductor device according to claim 11; wherein the epitaxial layer has a thickness in the range of from 0.1 μm to 10 μm.

13. A semiconductor device according to claim 11; wherein the epitaxial layer has a specific resistance in the range of from 0.01 Ωcm to 150 Ωcm.

14. A semiconductor device according to claim 11; wherein the heavily-doped region is formed of $BF_2$.

15. A semiconductor device according to claim 11; wherein the heavily-doped region has impurity concentration of at least 1E15 atm/cm$^3$.

16. A semiconductor device, comprising:

a semiconductor substrate having a first conductivity type;

a plurality of resistors formed from an epitaxial layer disposed on the semiconductor substrate and having a second conductivity type different from the first conductivity type, each of the resistors having interior and exterior portions;

a plurality of first trenches formed on the respective exterior portions of the resistors;

a plurality of second trenches formed in the respective interior portions of the resistors;

a first insulating film disposed in the first trenches;

a second insulating film disposed in the second trenches; and a heavily-doped region of the second conductivity type arranged at end portions of each of the resistors.

17. A semiconductor device according to claim 16; wherein each of the resistors has a substantially U-shaped configuration.

18. A semiconductor device according to claim 16; wherein the epitaxial layer has a thickness in the range of from 0.1 μm to 10 μm and a specific resistance in the range of from 0.01 Ωcm to 150 Ωcm.

* * * * *